United States Patent
Nakamura et al.

(10) Patent No.: US 12,414,472 B2
(45) Date of Patent: Sep. 9, 2025

(54) LAYERED STRUCTURE, PIEZOELECTRIC DEVICE USING THE SAME, AND METHOD OF MANUFACTURING PIEZOELECTRIC DEVICE

(71) Applicant: Nitto Denko Corporation, Ibaraki (JP)

(72) Inventors: Daisuke Nakamura, Ibaraki (JP); Naoki Nagaoka, Ibaraki (JP); Manami Kurose, Ibaraki (JP); Taketo Ishikawa, Ibaraki (JP); Hironobu Machinaga, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 1029 days.

(21) Appl. No.: 17/439,806

(22) PCT Filed: Mar. 10, 2020

(86) PCT No.: PCT/JP2020/010177
§ 371 (c)(1),
(2) Date: Sep. 16, 2021

(87) PCT Pub. No.: WO2020/189397
PCT Pub. Date: Sep. 24, 2020

(65) Prior Publication Data
US 2022/0181542 A1    Jun. 9, 2022

(30) Foreign Application Priority Data

Mar. 20, 2019   (JP) ................................ 2019-052877

(51) Int. Cl.
*H01L 41/053* (2006.01)
*H10N 30/00* (2023.01)
(Continued)

(52) U.S. Cl.
CPC ........... *H10N 30/708* (2024.05); *H10N 30/06* (2023.02); *H10N 30/076* (2023.02);
(Continued)

(58) Field of Classification Search
CPC .................................................... H10N 30/853
(Continued)

(56) References Cited

U.S. PATENT DOCUMENTS

2005/0184627 A1    8/2005   Sano et al.
2005/0236710 A1    10/2005  Akiyama et al.
(Continued)

FOREIGN PATENT DOCUMENTS

CN    1652458 A    8/2005
CN    1656623 A    8/2005
(Continued)

OTHER PUBLICATIONS

Office Action issued on Apr. 25, 2023, for corresponding Chinese Patent Application No. 202080021114.8, along with an English machine translation (15 pages).
(Continued)

*Primary Examiner* — Derek J Rosenau
(74) *Attorney, Agent, or Firm* — Hauptman Ham, LLP

(57) ABSTRACT

The occurrence of cracking in a functional layer is suppressed, while maintaining flexibility of a layered structure. The layered structure includes a polymer substrate, and a crystalline functional layer formed on the first surface of the substrate. The surface roughness of the first surface of the substrate is 3 nm or less in terms of arithmetic mean roughness (Ra).

8 Claims, 4 Drawing Sheets

(51) Int. Cl.
  *H10N 30/06* (2023.01)
  *H10N 30/076* (2023.01)
  *H10N 30/079* (2023.01)
  *H10N 30/853* (2023.01)
  *H10N 30/87* (2023.01)
(52) U.S. Cl.
  CPC ......... *H10N 30/079* (2023.02); *H10N 30/853* (2023.02); *H10N 30/878* (2023.02)
(58) Field of Classification Search
  USPC .................................................. 310/348, 358
  See application file for complete search history.

(56) References Cited

U.S. PATENT DOCUMENTS

| | | |
|---|---|---|
| 2008/0318034 A1 | 12/2008 | Murakami et al. |
| 2013/0320813 A1 | 12/2013 | Kurachi et al. |
| 2014/0285069 A1 | 9/2014 | Suenaga et al. |
| 2017/0051398 A1* | 2/2017 | Fujino .................. C23C 14/024 |
| 2020/0381610 A1 | 12/2020 | Arimoto et al. |

FOREIGN PATENT DOCUMENTS

| | | | |
|---|---|---|---|
| CN | 104078560 A | 10/2014 | |
| CN | 104364923 A | 2/2015 | |
| JP | 2018-46277 A | 3/2018 | |
| JP | 2018-93132 A | 6/2018 | |
| JP | 2018-137268 A | 8/2018 | |
| JP | 2018170503 A * | 11/2018 | ......... H01L 41/0478 |
| JP | 2019-11516 A | 1/2019 | |
| WO | 2017/209080 A1 | 12/2017 | |
| WO | 2018/163884 A1 | 9/2018 | |

OTHER PUBLICATIONS

Office Action issued on Sep. 18, 2023, for corresponding Korean Patent Application No. 10-2021-7029141, along with an English translation (13 pages).

Office Action issued on Aug. 16, 2022, for corresponding Japanese Patent Application No. 2019-052877, along with an English machine translation.

Office Action issued on Feb. 28, 2023, for corresponding Japanese Patent Application No. 2019-052877, along with an English machine translation (5 pages).

Akiyama et al., "Flexible piezoelectric pressure sensors using oriented aluminum nitride thin films prepared on polyethylene terephthalate films", Journal of Applied Physics 100, 2006, 114318-1~114318-5 (5 pages).

Office Action issued on Oct. 17, 2022 for corresponding Chinese Patent Application No. 202080021114.8, along with an English machine translation (15 pages).

The Extended European Search Report issued on Dec. 7, 2022 for corresponding European Patent Application No. 20772561.5 (6 pages).

Office Action dated May 28, 2024 for corresponding Korean Patent Application No. 10-2021-7029141, along with an English machine translation (7 pages).

International Search Report issued for corresponding International Patent Application No. PCT/JP2020/010177 on Jun. 2, 2020, along with an English translation.

Written Opinion issued for corresponding International Patent Application No. PCT/JP2020/010177 on Jun. 2, 2020.

* cited by examiner

LAYERED STRUCTURE, PIEZOELECTRIC DEVICE USING THE SAME, AND METHOD OF MANUFACTURING PIEZOELECTRIC DEVICE

CROSS REFERENCE TO RELATED APPLICATION

This application is a National Stage of International Application No. PCT/JP2020/010177, filed on Mar. 10, 2020, which designates the United States and was published in Japan, and which is based upon and claims priority to Japanese Patent Application No. 2019-052877, filed on Mar. 20, 2019, in the Japan Patent Office. All of the aforementioned applications are hereby incorporated by reference in their entireties.

TECHNICAL FIELD

The present invention relates to a layered structure, a piezoelectric device using the same, and a method of manufacturing a piezoelectric device.

BACKGROUND ART

Conventionally, a piezoelectric device, which makes use of the piezoelectric effect of a substance has been adopted. The piezoelectric effect is a phenomenon in which microscopic polarization occurs in proportion to a pressure applied to a substance. Various sensors such as pressure sensors, acceleration sensors, or acoustic emission (AE) sensors for detecting elastic waves have been manufactured by utilizing the piezoelectric effect.

In recent years, touch panels have been used as input interfaces of information processing devices such as smartphones, and applying piezoelectric devices to touch panels is increasing. A touch panel is integrated into the display device of an information processing device, and high transparency to visible light is required to improve the visibility. On the other hand, it is desirable for the piezoelectric layer to be highly responsive to pressure in order to accurately detect operations by a finger.

A structure in which a piezoelectric layer formed of a metal nitride having a Wurtzite crystal structure is provided on a flexible insulating film is known (see, for example, Patent Document 1). A structure in which an orientation control layer is inserted between a plastic layer and a piezoelectric layer is also known (see, for example, Patent Document 2).

PRIOR ART DOCUMENTS

Patent Document 1: JP Patent Application Laid-open Publication No. 2018-137268
Patent Document 2: JP Patent Application Laid-open Publication No. 2018-170503

SUMMARY OF THE INVENTION

Technical Problem to be Solved

When a crystalline functional layer is formed on the surface of a polymer substrate, microcracking often occurs in the functional layer due to the surface roughness of, or foreign substances on the polymer substrate. Even if an electrode film is inserted between the polymer substrate and the crystalline functional layer, it is difficult for the electrode film to absorb the roughness of the substrate surface, and unevenness remains on the surface of the electrode, reflecting the surface roughness of the substrate.

If cracks, pinholes, or the like occur in the functional layer due to the surface roughness of the underlayer, a leakage path which causes electrical short-circuit between the top and bottom electrodes is likely to be produced. This phenomenon becomes more prominent as the functional layer becomes thinner. Examples of the functional layer include a piezoelectric layer, a moisture-sensitive film, an odor-sensitive film, etc. If the functional layer cracks, the performance of the device deteriorates. Upon occurrence of a leakage path, the device may not function any longer.

An objective of the invention is to provide a layered structure capable of suppressing cracks from occurring in a functional layer, while maintaining the flexibility, and to provide a piezoelectric device using such a layered structure and a method of manufacturing the piezoelectric device.

Solution to Solve the Technical Problem

In the first aspect of the invention, a layered structure includes a polymer substrate, and a crystalline functional layer formed on the first surface of the substrate. The surface roughness of the first surface of the substrate is 3 nm or less in terms of arithmetic mean roughness (Ra).

In a second aspect of the invention, a piezoelectric device includes a polymer substrate, a piezoelectric layer formed on the first surface of the substrate, and a pair of electrodes provided on an upper side and a lower side of the piezoelectric layer in the layered direction. The surface roughness of the first surface of the substrate is 3 nm or less in terms of arithmetic mean roughness (Ra).

Advantageous Effect of the Invention

According to the above-described configurations, occurrence of cracks can be suppressed in the functional layer, while maintaining the flexibility of the layered structure.

DESCRIPTION OF EMBODIMENTS

First Embodiment

Figure 1:
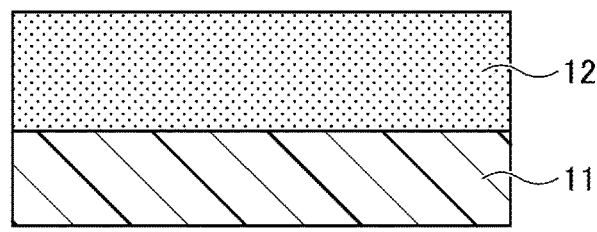
FIG. 1 is a schematic diagram of a layered structure according to a first embodiment.

FIG. 1 is a schematic diagram of a layered structure 10 according to the first embodiment. The layered structure 10 includes a polymer substrate 11, and a crystalline functional layer 12 provided on one surface of the substrate 11. The functional layer 12 is a layer having a specific function, such as a piezoelectric layer in which micro polarization occurs in response to a pressure applied, a temperature-sensitive magnetic film whose hysteresis characteristics change depending on temperature, or a crystalline nanoporous metal oxide film having a catalytic property.

By using the polymer substrate 11, the entirety of the layered structure 10 can be made flexible. In order to increase the flexibility, it may be desirable to reduce the thickness of the functional layer 12 to such an extent not to damage the expression of the function. However, the thinner the functional layer 12, the greater the influence of the surface condition of the underlayer, and cracks penetrating through the functional layer 12 may occur.

In the embodiment, the surface roughness of the substrate 11 on which the functional layer 12 is formed is set in a range suitable for exhibiting the device function.

The polymer used for the substrate 11 is, for example, polyethylene terephthalate (PET), polyethylene naphthalate (PEN), polycarbonate (PC), an acrylic resin, a cycloolefin polymer, polyimide (PI), or the like. Among these, polyethylene terephthalate (PET), polyethylene naphthalate (PEN), polycarbonate (PC), acrylic resin, and cycloolefin polymer are colorless and transparent materials.

The thickness of the substrate 11 is, for example, 20 to 200 µm, from the viewpoint of satisfying both flexibility and mechanical strength to support the layered structure.

A piezoelectric layer is formed as the functional layer 12 on the first surface (upper surface in FIG. 1) of the substrate 11. The piezoelectric layer is formed of, for example, a wurtzite crystal material.

A wurtzite crystal structure is represented by general formula AB, where A is a positive cation ($A^{n+}$) and B is a negative anion ($B^{n-}$). It is desirable to select a wurtzite piezoelectric material which can express piezoelectric properties to a certain degree or higher, and which can be crystallized in a low temperature process at or below 200° C. For example, zinc oxide (ZnO), zinc sulfide (ZnS), zinc selenide (ZnSe), zinc telluride (ZnTe), aluminum nitride (AlN), gallium nitride (GaN), cadmium selenide (CdSe), cadmium telluride (CdTe), silicon carbide (SiC), etc. can be suitably used. One or a combination of two or more of the above-described compounds may be used When two or more of the compounds are combined, layers of the selected compounds may be stacked one by one, or alternatively, a single layer may be formed using the targets of the selected compounds. The selected one or the combination of two or more of the compounds may be used as the main component, and other components may be optionally added. If a component other than the main component is added, the content of the component added as a sub-component is preferably from 0.1 to 30 at. %.

For example, a wurtzite material containing ZnO or AlN as the main component is used. A metal which that does not cause the main component to exhibit conductivity when incorporated in the main component may be added as a dopant. Such dopants may include silicon (Si), magnesium (Mg), vanadium (V), titanium (Ti), zirconium (Zr), lithium (Li), etc. One or a combination of two or more of the above-described dopants may be added. By adding one or more of these metals, the occurrence of cracking can be reduced. When a transparent wurtzite crystalline material is used for the piezoelectric layer, the layered structure is suitable for use in a display.

In order to ensure the flexibility of the layered structure 10 as a whole, it is desirable for the functional layer 12 to be made thin. However, in the case of the piezoelectric layer, it is difficult to achieve a sufficient level of polarization (namely, piezoelectricity) if the film is too thin. For a functional layer 12 made of a wurtzite piezoelectric material, the film thickness is, for example, 50 nm to 2 µm, preferably 200 nm to 1 µm.

The surface roughness of the first surface of the substrate 11 is 3 nm or less in terms of arithmetic mean roughness (Ra). By using a polymer substrate 11 with a smooth surface, the occurrence of cracking in the functional layer can be suppressed because of the reduced influence from the underlying structure.

Figure 2:
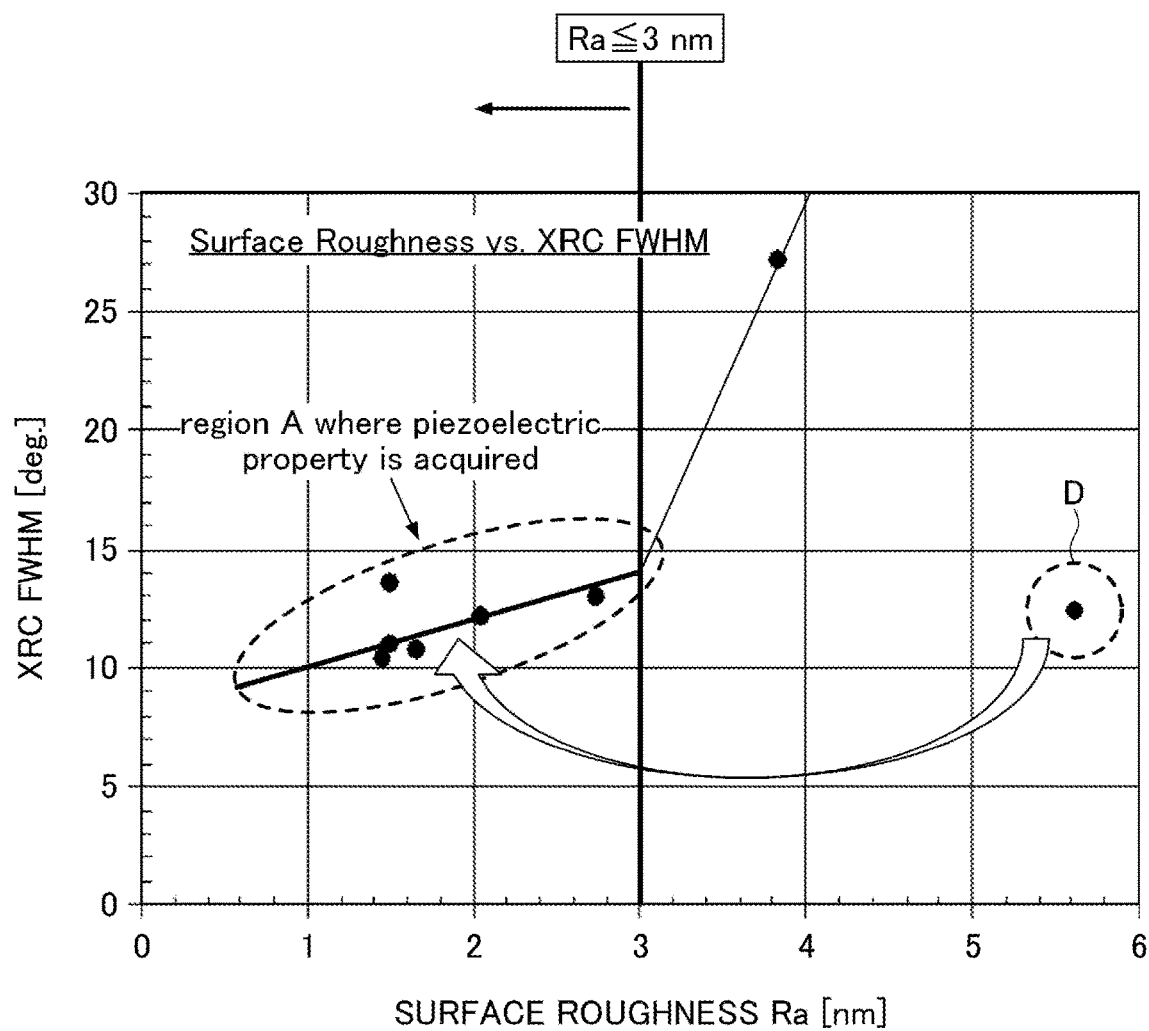
FIG. 2 is a diagram showing surface roughness required for a device characteristic.

FIG. 2 is a diagram showing the range of surface roughness of the substrate 11 suitable for achieving a satisfactory piezoelectric property. The horizontal axis represents arithmetic mean roughness (Ra), and the vertical axis represents full width at half-maximum (FWHM) of the X-ray Rocking Curve (XRC) expressed in degree.

The arithmetic mean roughness (Ra) is a parameter of the height or vertical direction, and represents the average value of the unevenness along the reference length. A part of the roughness curve, which is acquired by measuring the state of the interface using a roughness meter, is extracted along the reference length. In particular, a 1 µm×1 µm surface area is observed by an atomic force microscope (AFM) on various sample substrates. Although an AFM is used to measure the arithmetic mean roughness (Ra) in this example, the measuring method is not limited to the use of AFM. As long as the arithmetic mean roughness (Ra) can be evaluated, any suitable instrument such as a white interferometer or a stylus meter may be used.

XRC FWHM is an index representing crystal orientation. In this example, a ZnO layer having a thickness of 200 nm is formed on each of the sample substrates, and the reflection of the X-rays from the (0002) plane of ZnO is observed by locking curve measurement. The XRC FWHM of the reflected light from the (0002) plane indicates the C-axis orientation of the ZnO crystal. The smaller the XRC FWHM value, the better the crystal orientation and the higher the thickness-direction polarization. It is desirable that the XRC FWHM is less than 15 degrees in order to achieve an acceptable piezoelectric property which allows the device to operate. The surface roughness (Ra) of the substrate 11 corresponding to this XRC FWHM range is 3 nm or less.

In FIG. 2, a data point D with a surface roughness of 5.6 nm and an XRC FWHM of 12.5 degrees is observed. This data point is due to local protrusions present in the area extracted from the sample substrate. Excluding this data point, the arithmetic mean roughness (Ra) of this area is about 1.8 nm, which is within the region A where satisfactory piezoelectric property is achieved.

From this measurement result, it is derived that the surface roughness of the substrate 11 is 3 nm or less in order to achieve satisfactory piezoelectric property of the functional layer 12. This applies not only to the piezoelectric film, but also to other functional crystal films such as a temperature-sensitive magnetic layer or a catalyst layer, for achieving good crystal orientation with few pinholes or cracks. If these functional layers 12 are formed on the polymer substrate 11, it is similarly desirable for the surface roughness of the underlying substrate 11 to be 3 nm or less in arithmetic mean roughness.

Examples of the substrate with the above-described range of surface roughness include PET, PEN, PC, acrylic resin, cycloolefin polymer, polyimide, etc. Substrates made of these materials and having undergone a surface smoothing treatment may also be used.

Figure 3:
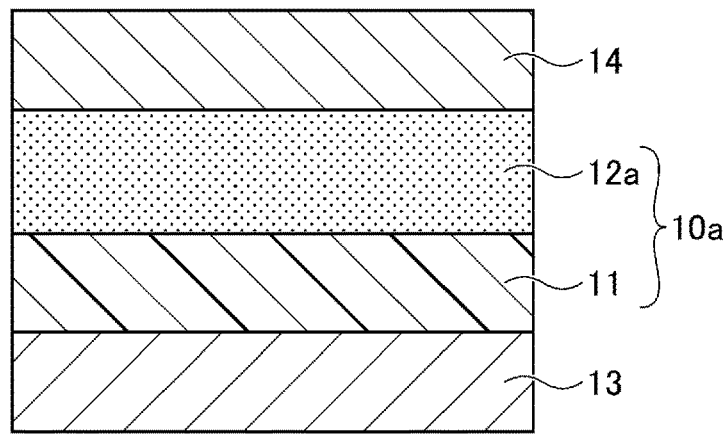
FIG. 3 shows an example configuration of a piezoelectric device.

FIG. 3 is a schematic diagram of a piezoelectric device 20A to which the layered structure 10 is applied. The piezoelectric device 20A has a layered structure 10a in which a piezoelectric layer 12a is provided as the functional layer 12 on the polymer substrate 11. In the piezoelectric device 20A, a first electrode layer 13, the polymer substrate 11, the piezoelectric layer 12a, and a second electrode layer 14 are stacked in this order.

When pressure or tensile stress is applied to the piezoelectric device 20A, polarization proportional to the pressure occurs in the piezoelectric layer 12a. By extracting the electric charges as an electric current through the first electrode layer 13 and the second electrode layer 14, the applied pressure or tensile stress can be detected.

Further, by applying a voltage to the piezoelectric layer 12a via the first electrode layer 13 and the second electrode layer 14, an inverse piezoelectric effect that causes the piezoelectric layer 12a to deform in the layered direction may be utilized. In this case, the piezoelectric device 20A can be used as a piezo actuator.

The materials of the first electrode layer 13 and the second electrode layer 14 are not limited as long as they are good conductors. When the piezoelectric device 20A is applied to a light transmissive (optically transparent) device, a transparent electrode may be used for one or both of the first electrode layer 13 and the second electrode layer 14, depending on the light incident direction and light emitting direction.

The piezoelectric device 20A is manufactured by, for example, the following process. A polymer film having a surface roughness (arithmetic mean roughness Ra) of 3 nm or less is prepared and used as the substrate 11. One of the main surfaces of the substrate 11, on which the piezoelectric layer 12a is to be formed, is referred to as "the first surface". The surface roughness (Ra) of the first surface is 3 nm or less.

The first electrode layer 13 is formed on the surface (back surface in FIG. 3) on the opposite side of the substrate 11 from the first surface. For example, an indium tin oxide (ITO) film is formed as the first electrode layer 13 by direct current (DC) or radio frequency (RF) magnetron sputtering.

A ZnO piezoelectric layer 12a having a film thickness of 50 to 200 nm is formed on the first surface of the substrate 11 by, for example, RF magnetron sputtering using a ZnO target. The material of the piezoelectric layer 12a is not limited to ZnO, and other materials such as ZnS, ZnSe, ZnTe, AlN, GaN, CdSe, CdTe, SiC, or a combination of two or more of these materials may be used, as described above. Alternatively, one or a combination of two or more of these materials may be used as the main component, and a metal such as Si, Mg, V, Ti, Zr, or Li, which does not cause the piezoelectric layer to exhibit conductivity, may be added.

If a high-dielectric polymer film is used as the substrate 11, the substrate 11 can be used as a part of the functional layer. If a conductive polymer film is used as the substrate 11, the substrate 11 can be used as a part of the electrode.

The second electrode layer 14 is formed on the piezoelectric layer 12a. An ITO film may be formed as the second electrode layer 14 by DC or RF magnetron sputtering, for example.

After the second electrode layer 14 is formed, the ITO films may be crystallized at a temperature below the melting point or the glass transition point (e.g., 130° C.) of the polymer substrate 11 to reduce the electrical resistance of the first electrode layer 13 and the second electrode layer 14; however, this heat treatment is not essential.

In the piezoelectric device 20A, the piezoelectric layer 12a is formed on the first surface of the substrate 11 having an arithmetic mean roughness Ra of 3 nm, and accordingly, cracks are suppressed and good polarization characteristics are achieved. Further, the piezoelectric device 20A has flexibility as a whole, and the device can be applicable to a wide range of products.

Figure 4:
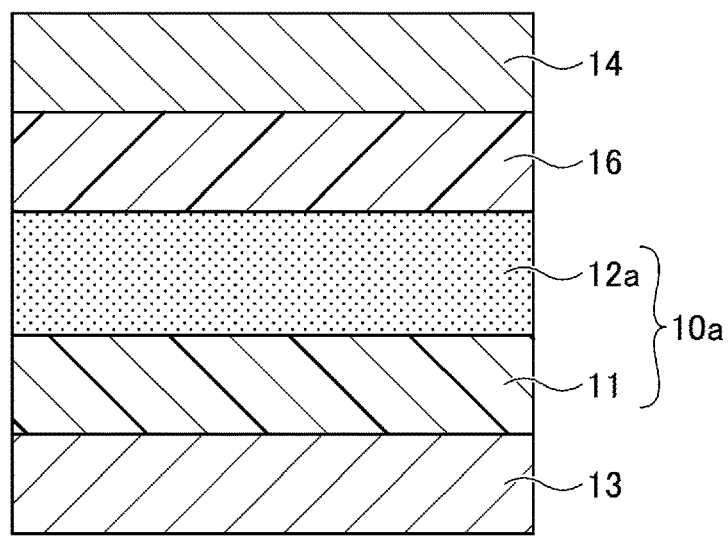
FIG. 4 shows another example configuration of the piezoelectric device.

FIG. 4 is a schematic diagram of a piezoelectric device 20B. In the piezoelectric device 20B, a polymer film 16 is inserted between the piezoelectric layer 12a and the second electrode layer 14. In other words, in the piezoelectric device 20B, the first electrode layer 13, the polymer substrate 11, the piezoelectric layer 12a, the polymer film 16, and the second electrode layer 14 are stacked in this order.

As in FIG. 3, the surface roughness of one of the main surfaces (i.e., the first surface) of the substrate 11, on which the piezoelectric layer 12a is formed, is 3 nm or less in arithmetic mean roughness (Ra). When the piezoelectric layer 12a is formed on the first surface of the polymer substrate 11, cracks can be suppressed, and the polarization characteristics (or piezoelectricity) can be maintained satisfactorily.

The piezoelectric device 20B is manufactured by, for example, the following process. The piezoelectric layer 12a is formed on the first surface of the substrate 11, and the first electrode layer 13 is formed on the surface on the opposite side of the substrate from the first surface, whereby the first part of the device is prepared. Meanwhile, a second electrode layer 14 is formed on one surface of the polymer film 16 to prepare the second part of the device.

The other surface of the polymer film 16 of the second part is brought so as to face the surface of the piezoelectric layer 12a of the first part, and bonded to the first part with an adhesive (not shown).

With this configuration, flexibility can be enhanced by providing polymer layers on both sides of the piezoelectric layer 12a in the layered direction. Further, even if a fine crack occurs in the piezoelectric layer 12a, occurrence of a leakage path which causes electrical short-circuits between the top and bottom electrodes can be prevented.

Figure 5:
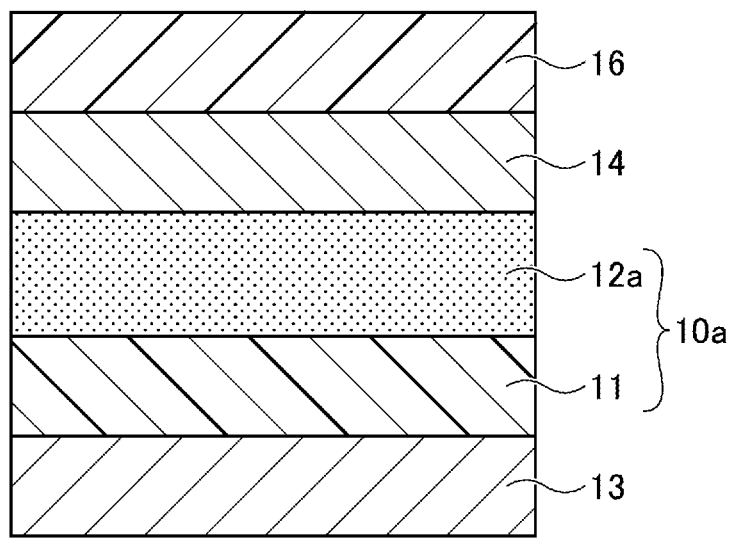
FIG. 5 shows still another example configuration of the piezoelectric device.

FIG. 5 is a schematic diagram of a piezoelectric device 20C. In the piezoelectric device 20C, the polymer film 16 is provided on the second electrode layer 14. That is, the first electrode layer 13, the polymer substrate 11, the piezoelectric layer 12a, the second electrode layer 14, and the polymer film 16 are stacked in this order.

Similar to FIG. 3 and FIG. 4, the surface roughness of at least one of the main surfaces of the substrate 11, namely, the surface roughness of the first surface on which the piezoelectric layer 12a is formed, is 3 nm or less in arithmetic average roughness Ra. By forming the piezoelectric layer 12a on the first surface of the polymer substrate 11, cracks can be suppressed, and the polarization characteristics (or piezoelectricity) can be maintained satisfactorily.

The piezoelectric device 20C is manufactured by, for example, the following process. The piezoelectric layer 12a is formed on the first surface of the substrate 11, and the first electrode layer 13 is formed on the surface on the opposite sde of the substrate 11 from the first surface to prepare the first part of the device. Meanwhile, a second electrode layer 14 is formed on one surface of the polymer film 16 to prepare the second part of the device.

The second electrode layer 14 of the second part is brought so as to face the surface of the piezoelectric layer 12a of the first part, and bonded to the first part with an adhesive (not shown).

In this configuration, by arranging the polymer material layers above and below the piezoelectric layer 12a in the layered direction, the flexibility can be enhanced and the occurrence of cracks in the piezoelectric layer 12a can be suppressed. The uppermost polymer film 16 can function as a protective film.

Second Embodiment

Figure 6:
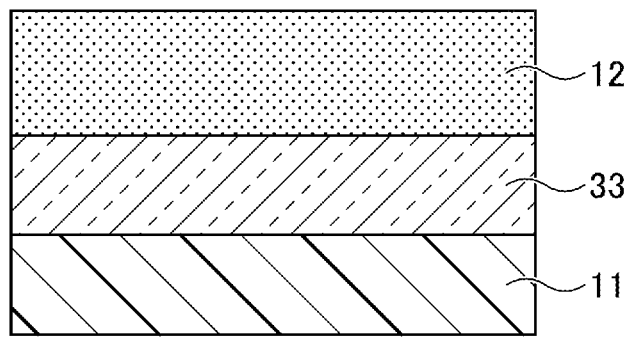
FIG. 6 is a schematic diagram of a layered structure according to a second embodiment.

FIG. 6 is a schematic diagram of a layered structure 30 according to the second embodiment. The layered structure 30 includes a polymer substrate 11, an amorphous layer 33 provided on the substrate 11, and a crystalline functional layer 12 provided on the amorphous layer 33.

The surface roughness of the substrate 11 is 3 nm or less in arithmetic average roughness Ra. By using a polymer base material 11 having such a smooth surface, the entirety of the layered structure 30 can be made flexible and the crystal orientation of the functional layer 12 can be improved.

In the second embodiment, the crystal orientation of the functional layer 12 is further improved by inserting an amorphous layer 33 between the polymer substrate 11 and the functional layer 12. The "amorphous layer" does not have to be 100% amorphous, and it refers to a layer in which 90% or more, preferably 95% or more is amorphous, and in which the interface with the functional layer 12 is amorphous.

If the layered structure 30 is applied to a device requiring transparency, the amorphous layer 33 may be formed of a transparent metal oxide. The thickness of the amorphous layer 33 is, for example, 3 to 200 nm, preferably 5 to 100 nm. By forming the crystalline functional layer 12 on the amorphous layer 33, the functional layer 12 can be grown without being affected by the underlying crystal structure. The functional layer 12 with less strain and good crystal orientation has few defects, and occurrence of cracks is suppressed.

If the amorphous layer 33 is an insulating layer, for example, silicon oxide (SiOx), silicon nitride (SiN), aluminum nitride (AlN), aluminum oxide ($Al_2O_3$), gallium nitride (GaN), gallium oxide ($Ga_2O_3$), etc. can be used. Alternatively, ZnO to which $Al_2O_3$ and $SiO_x$ are added, or GaN, AlN, ZnO or the like to which at least one of $Al_2O_3$, $Ga_2O_3$, $SiO_x$ and SiN is added may be used.

If the amorphous layer 33 is formed of an insulating organic film, an acrylic resin, a urethane resin, a melamine resin, an alkyd resin, a siloxane-based polymer, or the like can be used. As the organic substance, a thermosetting resin composed of a mixture of a melamine resin, an alkyd resin and an organic silane condensate may be used.

The amorphous layer 33 may be formed of an organic film to which a conductive dopant is added, and it may be used as an electrode. Alternatively, the amorphous layer 33 may be formed of a conductive metal oxide and used as an electrode.

As the conductive oxide, ITO, indium zinc oxide (IZO), or the like can be used. These materials are also suitable for devices that require light transmissive characteristics. The amorphous layer 33 of the conductive oxide can be formed by, for example, DC or RF magnetron sputtering to a thickness of 5 to 200 nm, more preferably 10 to 100 nm.

When ITO is used, the content of tin (Sn), namely the content ratio Sn/(In+Sn) may be 5 to 15 wt %. At a content ratio within this range, ITO is transparent to visible light, and an amorphous film can be formed by sputtering at room temperature.

When IZO is used, the content of zinc (Zn), namely the content ratio Zn/(In+Zn) may be around 10 wt %. At this content ratio, IZO is also transparent to visible light, and an amorphous film can be formed by sputtering at room temperature.

The amorphous layer 33 formed of the above-described materials has satisfactory surface smoothness, and allows the c-axis of the wurtzite-type material formed on the amorphous layer to be oriented in the growth direction. In addition, the amorphous layer has a high gas barrier property and can reduce the influence of gas derived from the polymer substrate 11 during film formation.

Figure 7:
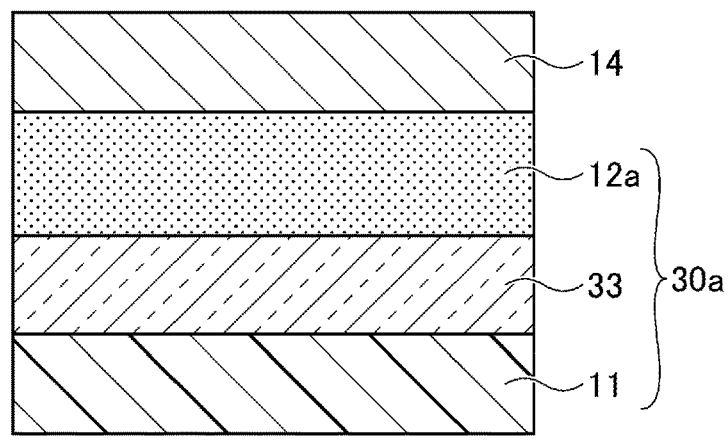
FIG. 7 shows an example configuration of a piezoelectric device using the layered structure of FIG. 6.

FIG. 7 is a schematic diagram of the piezoelectric device 40 using the layered structure 30a in which the functional layer 12 is formed as the piezoelectric layer 12a. In the piezoelectric device 40, the amorphous layer 33, the piezoelectric layer 12a, and the electrode layer 14 are stacked in this order on the polymer substrate 11. The amorphous layer 33 is formed of a conductive oxide and functions as a first electrode layer.

The piezoelectric device 40 is manufactured by, for example, the following process. A polymer film having a surface roughness (arithmetic mean roughness Ra) of 3 nm or less of the first surface is prepared, which is used as the substrate 11. An amorphous layer 33 having a thickness of 5 to 100 nm is formed of a conductive oxide such as ITO, IZO, IZTO, or IGZO on the first surface of the substrate 11 by DC or RF magnetron sputtering.

A piezoelectric layer 12a having a film thickness of 50 to 200 nm is formed on the amorphous layer 33 by, for example, RF magnetron sputtering.

A second electrode layer 14 is formed on the piezoelectric layer 12a.

In this configuration, the amorphous layer 33 is provided on the smooth polymer substrate 11 having an arithmetic mean roughness Ra of 3 nm or less, and the piezoelectric layer 12a is provided on the amorphous layer 33. The crystal orientation of the piezoelectric layer 12a is further improved, and good piezoelectric characteristics can be obtained.

Third Embodiment

Figure 8:
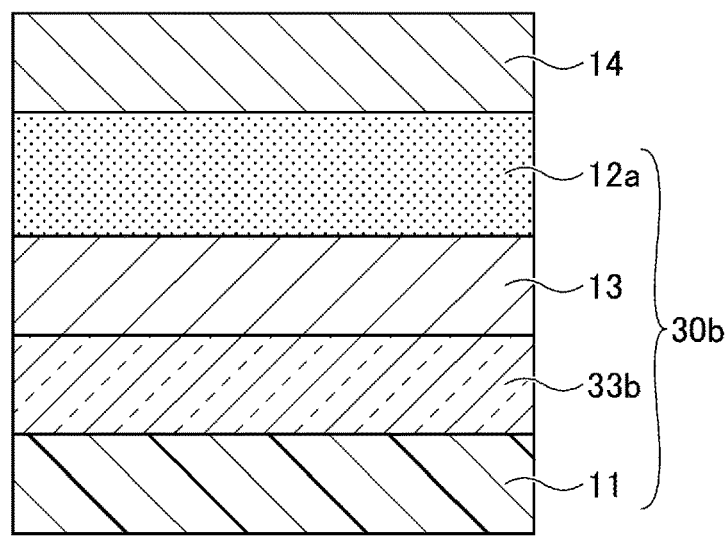
FIG. 8 shows an example configuration of a piezoelectric device using a layered structure according to a third embodiment.

FIG. 8 is a schematic diagram of a layered structure 30b of the third embodiment and the piezoelectric device 50 using the same. The layered structure 30b includes a polymer substrate 11, an amorphous layer 33b provided on the substrate 11, a first electrode layer 13 provided on the amorphous layer 33b, and a piezoelectric layer 12a provided on the first electrode layer 13. The piezoelectric layer 12a is an example of the crystalline functional layer 12, and has a film thickness of 50 to 200 nm.

The surface roughness of the polymer substrate 11 is 3 nm or less in arithmetic average roughness Ra. By using a polymer substrate 11 with such a smooth surface, the entirety of the layered structure 30b can be flexible, and the crystal orientation of the piezoelectric layer 12a is improved.

In the third embodiment, the amorphous layer 33b is provided between the substrate 11 and the first electrode layer 13, which is provided under the piezoelectric layer 12a. The amorphous layer 33b is formed of an inorganic material, an organic material, or a mixture of an inorganic material and an organic material. The "amorphous layer" does not have to be 100% amorphous, and it refers to a layer in which 90% or more, preferably 95% or more is amorphous, and in which the interface with the functional layer 12 is amorphous.

By providing the amorphous layer 33 under the first electrode layer 13, the crystal orientation of the first electrode layer 13 is improved, and the crystal orientation of the piezoelectric layer 12a formed on the first electrode layer 13 is further improved.

The piezoelectric device 50 can be fabricated by forming the second electrode layer 14 on the top of the layered structure 30b. Because the piezoelectric device 50 uses the layered structure 30b, the crystal orientation of the piezoelectric layer 12a is improved, and the piezoelectric characteristics are improved.

Although specific embodiments of the present invention have been described, the present invention is not limited to the above-described exemplified structures. For example, the layered structure 30 of FIG. 6 may be applied to the device configuration of FIG. 4 or FIG. 5. By forming the amorphous layer 33 of a conductive organic material, the flexibility of the entire piezoelectric device can be further improved.

The present application is based upon and claims priority to the earlier Japanese Patent Application No. 2019-052877 filed Mar. 20, 2019, the entirety of which is incorporated.

LISTING OF SYMBOLS 10, 10a, 30, 30a, 30b: layered structure
11: substrate
12: functional layer
12a: piezoelectric layer
13: first electrode layer
14: second electrode layer
16: polymer film
20A-20C, 40, 50: piezoelectric device
33: amorphous layer

What is claimed is:

1. A piezoelectric device comprising:
   a polymer substrate;
   a piezoelectric layer formed on a first surface of the substrate;
   a pair of electrodes including an upper electrode and a lower electrode, the upper electrode being provided on an upper side of the piezoelectric layer, and the lower electrode being provided on a lower side of the piezoelectric layer in a layered direction; and
   an amorphous conductive layer between the substrate and the lower electrode,
   wherein a surface roughness of the first surface of the substrate is 3 nm or less in arithmetic mean roughness (Ra).

2. The piezoelectric device as claimed in claim 1, wherein, the amorphous conductive layer between the substrate and the lower electrode is a first amorphous conductive layer, and the lower electrode is a second amorphous conductive layer.

3. The piezoelectric device as claimed in claim 2, wherein the second amorphous conductive layer is formed of an oxide conductor or a conductive organic material.

4. The piezoelectric device as claimed in claim 2, wherein the lower electrode is provided between the substrate and the piezoelectric layer.

5. The piezoelectric device as claimed in claim 1, wherein the amorphous conductive layer is formed of an inorganic material, an organic material, or a mixture of an inorganic material and an organic material.

6. The piezoelectric device as claimed in claim 1, wherein a thickness of the substrate is 20 to 200 µm.

7. The piezoelectric device as claimed in claim 1, wherein a thickness of the piezoelectric layer is 50 nm to 2 µm.

8. A method of manufacturing a piezoelectric device, comprising:
   forming an amorphous layer on a first surface of a polymer substrate, a surface roughness of the first surface being 3 nm or less in arithmetic mean roughness (Ra);
   forming a lower electrode on the amorphous layer;
   forming a piezoelectric layer on the lower electrode;
   forming the piezoelectric layer on the lower electrode; and
   forming an upper electrode on the piezoelectric layer.

* * * * *